United States Patent
Zschieschang et al.

(10) Patent No.: US 7,211,520 B2
(45) Date of Patent: May 1, 2007

(54) METHOD FOR FABRICATING A FIELD EFFECT TRANSISTOR

(75) Inventors: Ute Zschieschang, Erlangen (DE); Hagen Klauk, Erlangen (DE); Marcus Halik, Erlangen (DE); Guenter Schmid, Hemhofen (DE); Stefan Braun, Willich (DE)

(73) Assignee: Infineon Technologies AG, Munich (DE)

(*) Notice: Subject to any disclaimer, the term of this patent is extended or adjusted under 35 U.S.C. 154(b) by 125 days.

(21) Appl. No.: 11/066,330

(22) Filed: Feb. 25, 2005

(65) Prior Publication Data
US 2005/0191801 A1 Sep. 1, 2005

(30) Foreign Application Priority Data
Feb. 27, 2004 (DE) .................. 10 2004 009 601

(51) Int. Cl.
*H01L 21/302* (2006.01)
*H01L 21/461* (2006.01)

(52) U.S. Cl. .................. 438/745; 438/197; 438/142; 257/E21; 257/4; 257/17

(58) Field of Classification Search .......... 438/745, 438/142, 197, 680, 683, 685, 686, 687, 688, 438/725, 931, 733, 734, 756, 757, 722, 723, 438/785, 786, 787, 791

See application file for complete search history.

(56) References Cited

U.S. PATENT DOCUMENTS 6,713,389 B2 * 3/2004 Speakman .................. 438/674
6,881,490 B2 * 4/2005 Kambe et al. .............. 428/447

OTHER PUBLICATIONS

Zhenan Boa, et al "Printable organic and polymeric semiconducting materials and devices", J. Mater. Chem, 1999,9, pp. 1895-1904.
Marcus Halik, et al Relationship Between Molecules Structure and Electrical Performance of Oligothiophene Organic Thin Film Transistors, 2003 Wiley-vch Verlag GmbH & Co. pp. 917-922.
J. Collet, et al Low-voltage, 30 nm channel length, organic transistors with a self-assembled monolayer as gate insulating films, 2000 American Institute of Physics, pp. 1941-1943.

* cited by examiner

*Primary Examiner*—Davud Nhu
(74) *Attorney, Agent, or Firm*—Edell, Shapiro & Finnan, LLC

(57) ABSTRACT

A method for fabricating a field effect transistor, in which, after the etching of the gate electrode, the removal of the etching mask is omitted since the etching mask serves as a gate dielectric. The etching mask or the dielectric has a self-assembled monolayer of an organic compound.

20 Claims, 3 Drawing Sheets

METHOD FOR FABRICATING A FIELD EFFECT TRANSISTOR

CROSS REFERENCE TO RELATED APPLICATIONS

This application claims priority under 35 USC § 119 to German Application No. DE 10 2004 009 601.5, filed on Feb. 27, 2004, and titled "Method for Fabricating a Field Effect Transistor," the entire contents of which are hereby incorporated by reference.

BACKGROUND

Field effect transistors based on organic semiconductors are of interest for a multiplicity of electronic applications requiring extremely low production costs, flexible or unbreakable substrates, or the fabrication of transistors and integrated circuits over a large active area. For example, organic field effect transistors are suitable as pixel control elements in active matrix screens. Such screens are usually produced with field effect transistors based on amorphous or polycrystalline silicon layers. Typically, temperatures of more than 250° C. are necessary for fabricating high-quality transistors, which are based on amorphous or polycrystalline silicon layers requiring the use of rigid and fragile glass or quartz substrates. By virtue of relatively low temperatures (e.g., usually less than 200° C.) at which transistors based on organic semiconductors are fabricated, organic transistors permit the production of active matrix screens using inexpensive, flexible, transparent, unbreakable polymer films providing considerable advantages over glass or quartz substrates.

A further area of application for organic field effect transistors is the fabrication of very inexpensive integrated circuits that are used, for example, for the active labelling and identification of merchandise and goods. These so-called transponders are usually produced using integrated circuits based on monocrystalline silicon leading to considerable costs in the construction and connection technology. Producing transponders on the basis of organic transistors would lead to enormous cost reductions and could assist transponder technology en route to a worldwide breakthrough.

The fabrication of thin-film transistors usually requires a large number of steps in which the different layers of the transistor are deposited. In a first step, the gate electrode is deposited on a substrate, then the gate dielectric is deposited on the gate electrode, and the source and drain contacts are patterned in a further step. Finally, the semiconductor is deposited between the source and drain contacts on the gate dielectric.

Therefore, great effort is being made to simplify the fabrication process for field effect transistors. For example, available literature describes the use of printable molecular etching masks for pattern definition in the processing of organic transistors. For this purpose, an extremely thin molecular monolayer of a suitable organic material is applied to a metal layer and deposited over the whole area on the substrate, by a conformal relief stamp. In this case, the molecules are transferred to the metal in the regions of stamps in which the elevated structures of the stamp make contact with the metal surface. This form of relief printing is also referred to as microcontact printing or as flexographic printing. Such a method is described by J. L. Wilbur, A. Kumar, E. Kim and G. M. Whitesides ("Microfabrication by Microcontact Printing of Self-Assembled Monolayers", Advanced Materials, 1994, 6, 600–604). The organic molecules used in this case are ideally configured such that chemical bonds and a molecular self-assembled monolayer (SAM) form between the individual molecules and the metal surface. The molecular structures defined on the metal surface in this way serve as an etching mask in the subsequent process step and thus permit the targeted patterning of the metal layer by means of wet-chemical etching methods. Once the molecular monolayer has fulfilled its task as an etching mask, it is removed again in order to uncover the metal surface for the next process steps.

When the metal layer patterned in this way is used as a gate electrode of the transistor, the process that directly follows the removal of the molecular etching mask is the deposition of the gate dielectric for the purpose of electrically insulating the gate electrode from the organic semiconductor layer, which is deposited in a further process. Inorganic oxides or nitrides, such as, silicon oxide, silicon nitride, aluminum oxide or tantalum oxide, or insulating polymers, such as, polyvinlyphenol, are generally used as the gate dielectric in organic transistors.

The processing of gate dielectrics based both on inorganic oxides and nitrides and on insulating polymers generally requires relatively large layer thicknesses of approximately 100 nm or thicker and therefore necessitates relatively high supply voltages for operating the transistors. The supply voltages are in the region of approximately 10 volts or higher. In principle, although the supply voltages can be reduced by using thinner gate dielectrics, this reduction of the layer thickness in the case of the conventional dielectric materials, mentioned above, inevitably leads to an unacceptable increase in the leakage currents and generally to a reduction of the yield.

SUMMARY OF THE INVENTION

The present invention provides a method for fabricating a field effect transistor which has fewer process steps than conventional methods and additionally enables the fabrication of a field effect transistor which can be operated at a supply voltage of less than 5 volts, and in particular, less than three volts.

The method according to the invention comprises providing a substrate, depositing a whole area of a gate electrode, bringing the gate electrode into contact with an organic compound in order to obtain a self-assembled monolayer of the organic compound arranged on the gate electrode, wherein the organic compound includes a radical that interacts with the surface of the gate electrode, etching the gate electrode with the self-assembled monolayer of the organic compound arranged thereon, such that the self-assembled monolayer is essentially not removed, depositing and, if necessary, patterning of a source contact and a drain contact without removing the self-assembled monolayer; and subsequently, and depositing of a semiconductor material, in which case steps e) and f) can also be performed with their order reversed.

The self-assembled monolayer of the organic compound simultaneously serves as a dielectric and as an etching mask, so that it does not have to be removed after the etching of the gate electrode in order to pattern it.

Expediently, the conventionally required step of depositing the dielectric after the patterning of the gate electrode can be completely omitted in the case of the method according to the invention. It is merely necessary to ensure, during the subsequent deposition of the source and drain electrodes, an electrical short circuit does not occur between the source and drain contacts and the gate electrode. Such a short circuit can occur if the molecular wetting of the gate electrode along the vertical etching edges is insufficient, after the etching of the gate layer. If a sufficient undercut of the metal has occurred during the wet-chemical etching of the gate electrode the deposition along the etching edges can be completely omitted, for example. In the case of an insufficient molecular wetting of the gate layer along the etching edges after the etching of the gate electrode, the risk of electrical short circuits between the source and drain contacts and the gate electrode can be eliminated by renewed wetting of the gate layer with a molecular self-assembled monolayer.

Therefore, the invention employs the self-assembled monolayer of the organic compound, serves as a dielectric, and serves additioanally, as an etching mask, and as a gate dielectric. The monolayer serves as an etching mask during the patterning of the gate electrode by means of etching, and as a gate dielectric, obviating the need for removal of the self-assembled monolayer after etching. Thus, resulting in a simplification of the fabrication process.

In order to minimize the risk of a short circuit between the gate electrode and the source or drain electrode, in an advantageous embodiment, after the etching of the gate electrode with the self-assembled monolayer of the organic compound arranged thereon, the gate electrode is rewetted with the organic compound, in order to deposit the organic compound along the etching edges.

In the advantageous embodiment, the gate electrode has a metal oxide layer at the surface. In this embodiment, appropriate materials for this layer are materials with a native oxide layer or an oxide layer produced in a targeted manner, such as, aluminum, titanium, titanium nitride, tantalum, tantalum nitride, tungsten, titanium tungsten, tantalum tungsten, tungsten nitride, tungsten carbonitride, iridium oxide, ruthenium oxide, strontium ruthenium oxide, or a combination of these layers and/or materials. Additionally, if appropriate, a layer made of silicon, titanium nitride silicon, silicon oxynitride, silicon oxide, silicon carbide or silicon carbonitride, can be appropriate.

The layer of the self-assembled monolayer of the organic compound, serving as an etching mask, is preferably deposited onto the gate electrode by means of a printing method.

In a preferred embodiment, the self-assembled layer of the organic compound is transferred to the surface of a metal layer, vapor-deposited onto a substrate, by a specially produced relief stamp made of polydimethylsiloxane.

In a particularly preferred embodiment, the organic compound that forms the self-assembled monolayer has a radical that interacts with the surface of the gate electrode.

Many radicals that interact with the surface of the gate electrode are appropriate depending on the material used for the gate electrode and on the surface of the gate electrode. The following groups are mentioned by way of example: R—$SiCl_3$, R—$SiCl_2$, alkyl, R—SiCl(alkyl)$_2$, R—Si(OR)$_3$, R—Si(OR)$_2$alkyl, R—SiOR(alkyl)$_2$, R—PO(OH)$_2$, R—CHO, R—CONHNHW$_2$, R—CH=CH$_2$, R—COH, R—PO(OR)$_2$(alkyl). R—CONH$_2$, R—CONHOH, R—OH, R—NH$_2$, SH, OH, NH$_2$, COOH, CONH$_2$, CONHOH or CONHNH$_2$. The self-assembled monolayer arranged on the gate electrode is intended to have a high substrate specificity and also a high thermal, chemical and mechanical stability of the layer. The group R is to be selected arbitrarily, it being advantageous if R has a group comprising n-alkyl, n-alkyl (thio)ether, linear aromatic groups of the formula —($C_6H_4$)—, where n is an integer between 2 and 6, and R may also be a heteroaromatic group. It is advantageous that the organic compound is oriented linearly, in order to stabilize the self-assembled monolayer through the lateral interactions of the R group, such as through $\pi\pi$, dipole-dipole or CT interactions.

The etching of the gate electrode in order to pattern the electrode is preferably carried out by means of wet-chemical etching methods. If the gate electrode comprises aluminum, for example, the substrate may be dipped into a mixed acid solution for approximately one minute. The solution preferably comprises orthophosphoric acid, nitric acid, acetic acid and water. The concentration of the acids present in the solution for wet-chemical etching is to be chosen such that the layer of the organic compound that forms a self-assembled monolayer on the gate electrode is essentially not removed. The solution may contain, for example, between approximately 60 and 90% by weight orthophosphoric acid, approximately 2 to 8% nitric acid, approximately 2 to 8% acetic acid and the remainder water.

The thickness of the gate electrode is between approximately 20 and 300 nm, preferably between approximately 20 and 100 nm. In a particular embodiment, the thickness of the gate electrode is approximately 20 to 50 nm.

The thickness of the self-assembled monolayer of the organic compound corresponds to the length of the organic molecule since only one molecular layer is involved in this case. Depending on the length of the organic molecule, and in this context of the group R, the thickness of the self-assembled monolayer is between approximately 1 nm and 20 mn. The organic compounds which produce a thickness of the self-assembled monolayer of approximately 2 to 10 nm are particularly preferred.

Once the gate electrode has been patterned by preferably wet-chemical etching, if appropriate, renewed wetting with the organic compound is effected along the etching edges, by dipping into an alcoholic solution of the organic compound.

Source and drain contacts are subsequently vapor-deposited and patterned.

In the last step, the semiconductor is deposited, the semiconductor being an organic polymer in a particularly preferred embodiment.

In a preferred embodiment, the polymer comprises, for example, pentacene, tetracene or polythiophene.

The very small thickness of the gate dielectric defined by the self-assembled monolayer of the organic compound makes it possible for a field effect transistor, which can be fabricated by the method according to the invention, to be operated with a supply voltage of less than 5 volts, and less than 3 volts in a preferred embodiment.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will now be explained in more detail with reference to the figures.

FIGS. 3A–3D shows a schematic cross section of a structure with insufficient molecular wetting of the gate electrode along the etching edges;

DETAILED DESCRIPTION

Figure 1A:
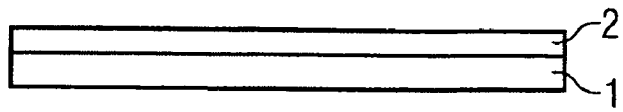
FIGS. 1A–1E shows a process sequence in the fabrication of a conventional field effect transistor.
Figure 1B:
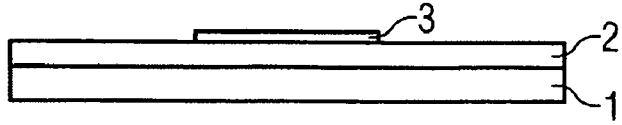
Figure 1C:

FIG. 1 illustrates the necessary steps in the fabrication of a conventional field effect transistor. In FIG. 1a, a layer 2 of a material used for the fabrication of the gate electrode is deposited on a substrate 1. As illustrated in FIG. 1b, an etching mask 3 is thereupon deposited onto the layer of gate electrode 2, preferably by means of a printing technique. FIG. 1c illustrates the result after the etching step and the patterning of the gate electrode. It can be seen from FIG. 1c that the etching edges 4 are uncovered.

Figure 1D:
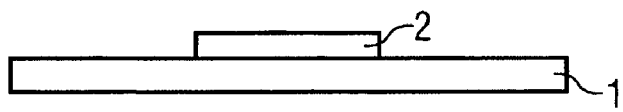

In FIG. 1d, the etching mask 3 then has to be removed before a dielectric 5 is deposited above the gate electrode.

In accordance with the method according to the invention, it can be seen that the step of removing the etching mask 3 is completely omitted since the self-assembled molecular monolayer of the organic compound 3a serves both as the etching mask 3 and as the dielectric layer 5 for the subsequent process. The process sequences, comparable with the steps illustrated in FIGS. 1a to 1e, are illustrated in FIG. 2.

Figure 1E:
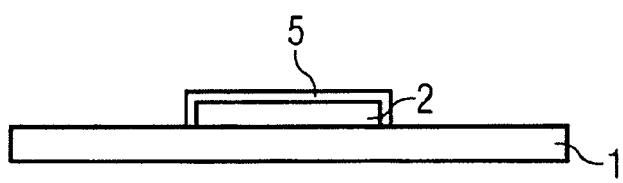
Figure 2A:
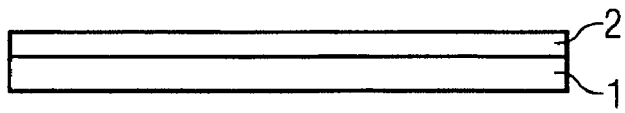
FIGS. 2A–2D shows a process sequence in the fabrication of a field effect transistor according to the invention.
Figure 2B:
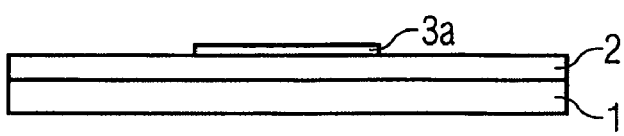
Figure 2C:
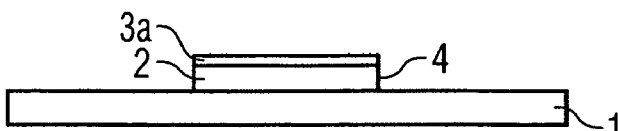
Figure 2D:
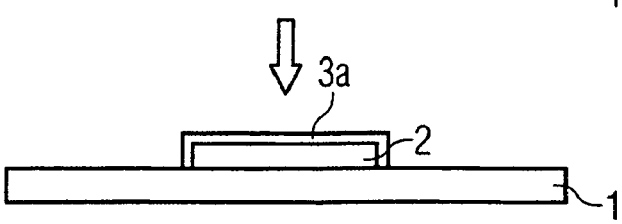

As shown in the case of the invention's multiple use of the molecular monolayer 3a, not only can the process step of removing the etching mask 3 be omitted, but also the process step illustrated in FIG. 1e and 2d, respectively. These process steps can be eliminated if, during the subsequent deposition of the source electrode 6 and drain electrode 7, an electrical short circuit between the source 6 and drain electrodes 7 and the gate electrode 2 does not occur. Such a short circuit can occur if the molecular wetting is insufficient of the gate layer, along the etching edges 4, after the etching of the gate layer. This situation is illustrated schematically in FIG. 3.

Figure 3A:
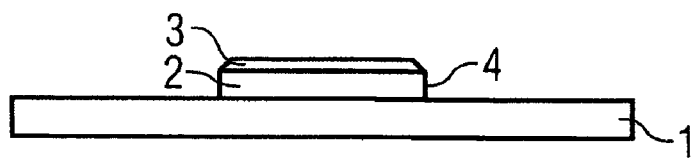
Figure 3B:
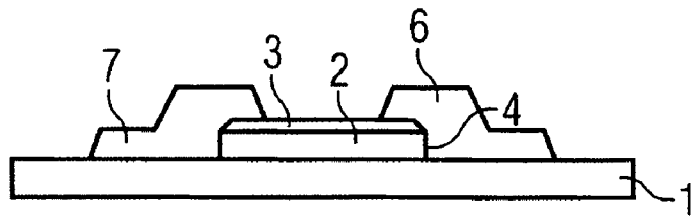

In the case of an insufficient molecular wetting of the gate layer along the etching edges, as is illustrated for example in FIG. 3a, the risk of electrical short circuits between the source 6 or drain electrodes 7 and the gate electrode 2 can be eliminated by renewed wetting of the gate layer along the etching edges 4 with a molecular self-assembled monolayer 3a.

Figure 4A:
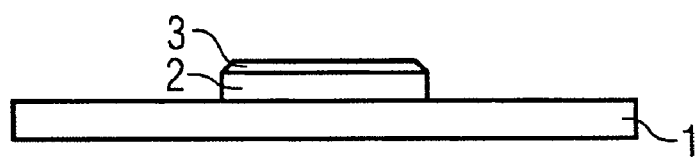
FIGS. 4A–4C shows a schematic process sequence for the renewed wetting of the gate electrode along the etching edges.
Figure 4B:
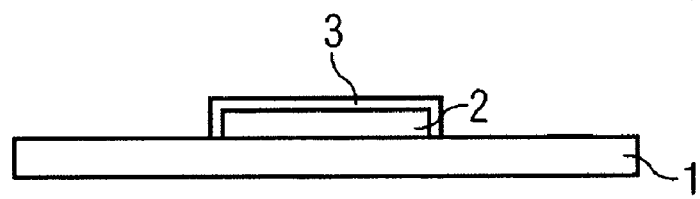
Figure 4C:
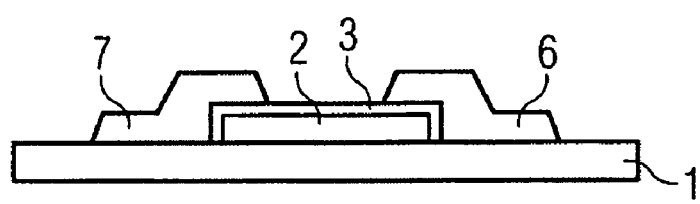

This step is illustrated in FIG. 4. The result after the deposition and patterning of the source 6 and drain electrodes 7 is illustrated in FIG. 4.

Figure 5A:
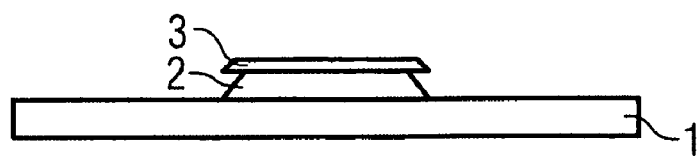
FIGS. 5A–5B shows a schematic cross section of a structure with a sufficient undercut.
Figure 5B:
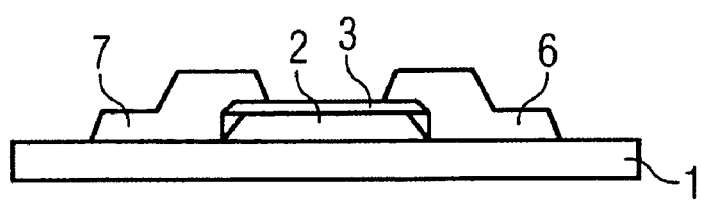

The renewed wetting of the etching edges can be dispensed with, if a short circuit cannot occur. That might be the case if a sufficient undercut of the metal has occurred as a result of the wet-chemical etching of the gate layer 2, as illustrated in FIG. 5a. The situation has been illustrated in FIG. 5a and FIG. 5b, respectively.

The fabrication of the field effect transistor according to the invention is explained on the basis of the example below.

Aluminum is used as gate material and, by way of example, an n-alkylphosphonic acid is explained as the organic compound. A self-assembled monolayer of the n-alkylphosphonic acid is transferred on an aluminum layer, vapor-deposited onto a glass substrate and having a thickness of approximately 20 nm, by means of a specially produced relief stamp made of polydimethylsiloxane. For wet-chemical etching of the aluminum, the substrate is dipped into a mixed acid solution comprising 80% orthophosphoric acid, 5% nitric acid, 5% acetic acid and 10% water for approximately one minute. If necessary, the aluminum gate layer is wetted anew by being dipped into an alcoholic phosphonic acid solution. A layer of gold having a thickness of approximately 30 nm is subsequently vapor-deposited and patterned, for example, using photolithography and wet-chemical etching. In the last step, the organic semiconductor layer is deposited, for example, by thermal evaporation of pentacene.

Figure 6:
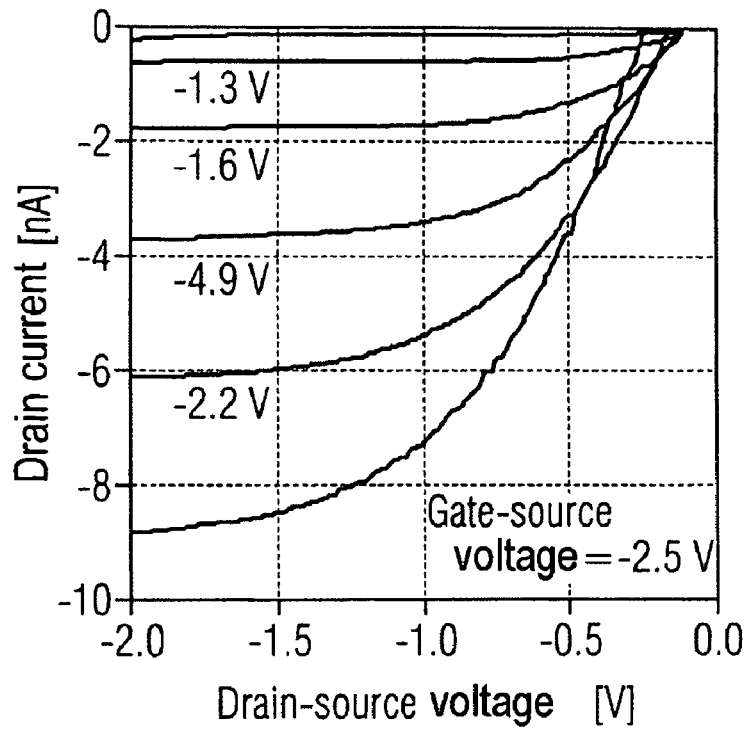
FIG. 6 shows current-voltage characteristic curves of a field effect transistor according to the invention.
Figure 7:
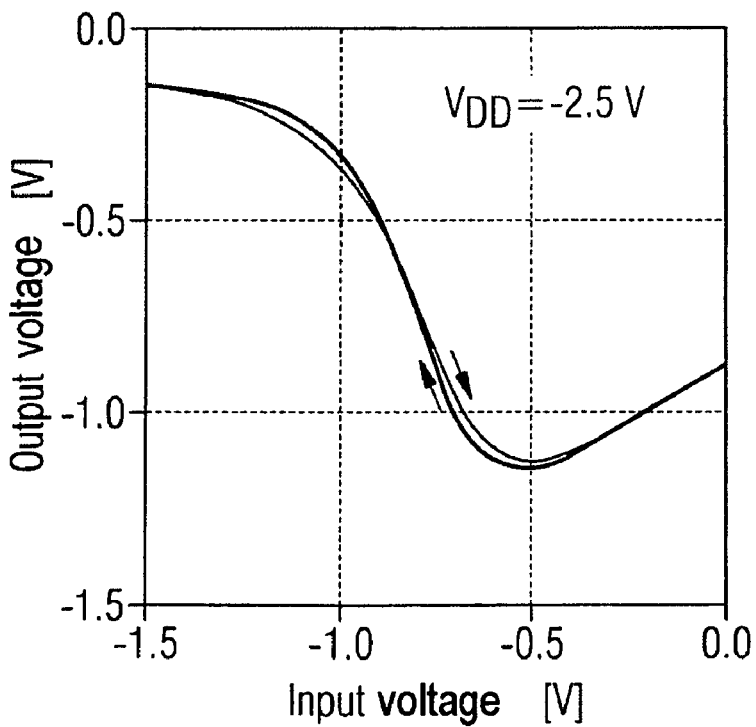
FIG. 7 shows current-voltage characteristic curves of an inverter with a saturated load.

The properties of a field effect transistor fabricated by the example are illustrated in FIGS. 6 and 7. FIG. 6 shows the current-voltage characteristic curves of a pentacene transistor and FIG. 7 shows those of an inverter with a saturated load which has been fabricated by the invention's multiple use of a printed molecular self-assembled monolayer of the phosphonic acid derivative as a mask and as a dielectric for the wet-chemical etching of the aluminum gate electrodes. A thermally oxidized silicon wafer was used as the substrate; the source and drain contacts were produced, as described above, by deposition and wet-chemical patterning of a thin gold layer.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1 substrate
2 gate electrode or gate electrode material
3 etching mask
3a self-assembled monolayer of an organic compound
4 etching edge(s)
5 gate dielectric
6 source electrode
7 drain electrode

What is claimed is:

1. A method for fabricating a field effect transistor, comprising:
   a) providing a substrate;
   b) depositing a gate electrode onto a whole area of the substrate;
   c) bringing the gate electrode into contact with an organic compound in order to obtain a self-assembled monolayer of the organic compound arranged on the gate electrode, wherein the organic compound includes a radical that interacts with a surface of the gate electrode, the radical comprising a constituent selected from the group consisting of: $SiCl_3$, $SiCl_2$ alkyl, $SiCl(alkyl)_2$, $Si(OR)_3$, $Si(OR)_2$alkyl, $SiOR(alkyl)_2$, $PO(OH)_2$, $PO(OR)_2(alkyl)$, CHO, $CH=CH_2$, COH, $CONH_2$, CONHOH, $CONHNH_2$, OH, $NH_2$, SH, or COOH;
   d) etching the gate electrode with the self-assembled monolayer of the organic compound arranged thereon such that the self-assembled monolayer essentially is not removed;

e) depositing a source electrode and a drain electrode without removing the self-assembled monolayer; and f) depositing a semiconductor material either before or after depositing the source and drain electrodes.

2. The method as claimed in claim 1, wherein after etching the gate electrode with the self-assembled monolayer of the organic compound arranged thereon, the gate electrode is rewetted with the organic compound.

3. The method as claimed in claim 1, wherein the gate electrode includes a metal oxide layer at the surface.

4. The method as claimed in claim 3, wherein the gate electrode is selected from the group consisting of: titanium, titanium nitride, tantalum, tantalum nitride, tungsten, titanium tungsten, tantalum tungsten, tungsten nitride, tungsten carbonitride, iridium oxide, ruthenium oxide, strontium ruthenium oxide, or from a combination of these layers and or materials and, has a layer made of silicon, titanium nitride silicon, silicon oxynitride, silicon oxide, silicon carbide or silicon carbonitride.

5. The method as claimed in claim 1, wherein the process of bringing the gate electrode into contact with the organic compound is effected by a printing technique.

6. The method as claimed in claim 5, wherein the process of bringing the gate electrode into contact with the organic compound is effected by microcontact printing.

7. The method as claimed in claim 1, wherein the organic compound includes a radical that interacts with the surface of the gate electrode.

8. The method as claimed in claim 1, wherein the etching of the gate electrode with the self-assembled monolayer of the organic compound arranged thereon is effected by wet-chemical etching methods.

9. The method as claimed in claim 8, wherein the etching is effected by a solution comprising phosphoric acid.

10. The method as claimed in claim 9, wherein the solution additionally comprises nitric acid.

11. The method as claimed in claim 9, wherein the solution additionally comprises acetic acid.

12. The method as claimed in claim 1, wherein the source and drain electrodes, independent of each other, are selected from the group consisting of: gold, silver, copper, platinum, palladium, titanium, titanium nitride, tantalum, tantalum nitride, tungsten, titanium tungsten, tantalum tungsten, tungsten nitride, tungsten carbonitride, iridium oxide, ruthenium oxide, strontium ruthenium oxide, or from a combination of these layers and/or materials and, additionally have a layer made of silicon, titanium nitride silicon, silicon oxynitride, silicon oxide, silicon carbide or silicon carbonitride.

13. The method as claimed in claim 1, wherein the thickness of the gate electrode is between approximately 20 and 300 nm.

14. The method as claimed in claim 1, wherein the thickness of the gate electrode is between approximately 20 and 100 nm.

15. The method as claimed in claim 1, wherein the thickness of the gate electrode is between approximately 20 and 50 nm.

16. The method as claimed in claim 1, wherein the thickness of the self-assembled monolayer of the organic compound is between approximately 1 and 20 nm.

17. The method as claimed in claim 1, wherein the thickness of the self-assembled monolayer of the organic compound is between approximately 2 and 10 nm.

18. The method as claimed in claim 1, wherein the semiconductor material includes an organic semiconductor material.

19. The method as claimed in claim 18, wherein the organic semiconductor material is selected from the group consisting of pentacene, tetracene and polythiophene.

20. The method as claimed in claim 1, wherein the radical further comprises a constituent R having a group selected from the group consisting of: n-alkyl (thio)ether, linear aromatic groups of the formula —$(C_6H_4)_n$—, where n is an integer between 2 and 6, and a heteroaromatic group.

* * * * *